(12) United States Patent
Layman et al.

(10) Patent No.: US 6,738,294 B2
(45) Date of Patent: May 18, 2004

(54) ELECTRONIC FINGERPRINTING OF SEMICONDUCTOR INTEGRATED CIRCUITS

(75) Inventors: Paul Arthur Layman, Orlando, FL (US); Samir Chaudhry, Weston, FL (US); James Gary Norman, Orlando, FL (US); J. Ross Thomson, Clermont, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/262,654

(22) Filed: Sep. 30, 2002

(65) Prior Publication Data

US 2004/0062084 A1 Apr. 1, 2004

(51) Int. Cl.⁷ .................................................. G11C 7/00
(52) U.S. Cl. ..................... 365/189.01; 365/154; 365/201
(58) Field of Search ......................... 365/189.01, 201, 365/154, 185.04

(56) References Cited

U.S. PATENT DOCUMENTS

| | | | | |
|---|---|---|---|---|
| 4,833,306 A | | 5/1989 | Milbrett | 235/375 |
| 5,302,491 A | | 4/1994 | Akylas et al. | 430/311 |
| 5,701,274 A | * | 12/1997 | Akaogi et al. | 365/230.01 |
| 6,188,242 B1 | * | 2/2001 | Mahajan et al. | 326/41 |
| 6,262,919 B1 | * | 7/2001 | Chou | 365/189.03 |
| 6,282,134 B1 | * | 8/2001 | Kumar | 365/201 |
| 6,580,648 B1 | * | 6/2003 | Barnes | 365/189.02 |

\* cited by examiner

*Primary Examiner*—Tan T. Nguyen
(74) *Attorney, Agent, or Firm*—John L. DeAngelis, Jr.; Beusse Brownlee Wolter Mora & Maire, P.A.

(57) ABSTRACT

A method of identifying an integrated circuit device based on the initial state of certain memory cells within a memory array of the integrated circuit device. For many cells in the memory array the initial state is relatively consistent at each power-up, due to mismatches between the transistors that form each memory cell. Thus these consistent initial states provide a signature of the memory array and the integrated circuit device.

13 Claims, 5 Drawing Sheets

ELECTRONIC FINGERPRINTING OF SEMICONDUCTOR INTEGRATED CIRCUITS

FIELD OF THE INVENTION

The present invention relates generally to the identification of individual semiconductor die on a semiconductor wafer, and more specifically to a method and apparatus for providing the identification based on values stored in a semiconductor memory.

BACKGROUND OF THE INVENTION

During the semiconductor fabrication process wafers are subjected to a number of processing operations, such as layering, patterning doping and heat treating. It is desirable to track the wafer throughout the manufacturing process to prevent wafer mis-processing and to maintain an accurate record of the processing steps to which the wafer was subjected. To provide the necessary unique identification for each wafer, conventionally bar codes or other identifying indicia are printed or laser engraved on the wafer surface.

Bar codes consist of a number of spaced apart parallel lines of varying widths, with data encoded in the line width and the line spacing. As the wafer is processed through the fabrications steps, an optical probe scans the wafer in a direction normal to the bar code lines. An incident light beam in the probe is modulated by the bar code lines to produce a reflected beam that caries the unique signature of the scanned bar code. The reflected light beam is directed to and detected by an electro-optical detector such that the detected electronic signal represents the scanned bar code. The code is associated with the wafer and thus is utilized to track the wafer during the fabrication process steps. In lieu of bar codes, it is also known to use laser inscribed dots to identify the wafer.

It is also desirable to track each individual die of a wafer by associating each die with the source wafer, the manufacturing lot and/or the die site (i.e., the location of the dice on the wafer) identifier. This information can later be useful to track yields in a particular wafer region and to identify the source wafer and lot if the die later fails during testing or in the field. Although this information can be physically added to each die by a bar code or laser inscribed dots, as described above, this may not be done due to the added processing cost. Also, once the die is packaged, the identification information is lost unless the package is also marked. Typically, packages are marked with manufacturing lot information, but the lot identifier is identical for a large number of die and thus the lot information can be efficiently applied, by silk screening, for example, to all packages containing die from the same lot. However, including individual die identification information on each package is costly.

FIG. 1 illustrates a wafer 10 on which are formed a plurality of circuit dice 12. Although only four such dice 12 are illustrated in FIG. 1 for convenience, it is known by those skilled in the art that a considerably greater number of circuit dice could be formed in the wafer 10 as is conventional in the art. Disposed in one corner of each dice 12 is an identification element 16, such as a bar code or laser inscribed dots, as discussed above.

It is known to add programmable memory circuitry to individual die to provide an indicia for later identification of the die site, wafer and manufacturing lot. The circuitry is electrically programmed during the wafer test phase or physically programmed during wafer laser repair with a serial number or other unique identifier. Laser wafer repair is typically used to select working memory blocks from a wafer during the functional test process by trimming interconnects on the wafer. This process can also be used to program circuitry that can be used later to identify the device. The identifier can be read from the device after it is placed into service to determine the die site, wafer and/or lot from which the die was taken. However, adding such programmable circuitry adds cost because it requires die area, and may also increase the pin count and fabrication process complexity. For relatively inexpensive integrated circuits, the extra cost may not merit the advantages provided.

Random access memory devices, especially static random access memories, are well known in the art. Such devices are comprised of a plurality of memory cells, each cell storing a single bit of information in the form of a binary 1 or a binary 0. Each cell is a flip-flop positioned at the intersection of an array of row and column address lines, also referred to as wordlines and bitlines, respectively. Specifically, each cell is positioned at the intersection of a word line and a set of complimentary bit lines, that is, a bit line and an inverse bit line. These memory devices provide random access in the sense that each cell can be individually addressed for read and write operations as determined by an address provided to a row and column address decoder, that in turn selects the intended cell at the intersection of the row and column address lines. Generally, the row or wordline is selected first, enabling all the cells on the selected row. The bitline and the inverse bitline select the individual column bit from among the selected row of cells, for reading a bit from or writing a bit to the selected cell over the bitline and the inverse bitline.

FIG. 2 is an exemplary schematic of four such adjacent static random access (SRAM) cells 20, 21, 22 and 23 constituting an SRAM memory array 18, having n wordlines (wordline 0 to wordline n) and m bitlines (bitline 0 to bitline m). Each of the memory cells 20, 21, 22 and 23 comprises six metal-oxide field-effect transistors (MOSFETS) arranged as two cross-coupled complementary MOSFETS (i.e., CMOS) inverters. Each of the cells 20, 21, 22 and 23 includes the same basic components and functions in the same manner. Thus only the cell 20 is described in detail.

The cell 20 includes NMOS switching transistors 30 and 32 having their gate terminals connected to a wordline 0. Source and drain terminals of the transistor 30 are connected between a bitline 0 and a node 34. Source and drain terminals of the transistor 32 are connected between an inverse bitline 0 and a node 36. A first source/drain terminal of NMOS transistors 40 and 42 is connected to ground. A first source/drain terminal of PMOS transistors 46 and 48 is connected to a supply voltage, designated $V_{DD}$. A second source/drain terminal of the transistors 40 and 42 is connected to a second source/drain terminal of the transistors 46 and 48 at the nodes 34 and 36, respectively. The node 34 is further connected to a gate terminal of each transistor 42 and 48. The node 36 is further connected to a gate terminal of each of the transistors 40 and 46.

In operation, the cross-coupling of the two CMOS inverters (where the first inverter comprises the transistors 40 and 46 with the node 34 serving as the output terminal, and the second inverter comprises the transistors 42 and 48 with the node 36 serving as the output terminal) creates a bistable device. If the output of the first inverter is high (that is, the transistor 46 is on, the transistor 40 is off and the voltage at the node 34 is high), the high voltage at the node 34 is provided as an input to the gate terminals of the transistors 42 and 48 that comprise the second inverter. As a result, the second inverter is driven low (that is, the transistor 48 is off, the transistor 42 is on and the voltage on the node 36 is low). The state of the cell 20 where the first inverter is high can be considered a "1" state. If the transistors 40, 42, 46 and 48 are in an opposite state to that described above, the first inverter output is low and the second inverter output is high. This state can be considered the "0" state for the cell 20. In the "0" state, the node 34 is low and the node 36 is high.

To write a bit to the cell 20, the wordline 0 is selected, turning on the transistors 30 and 32. The bitline 0 and the inverse bitline 0 are charged to opposite states by a writer-driver, not shown, to store the bit on the bitline 0 to the memory cell 20. If a "1" on the bitline 0 is to be stored, the transistor 48 is driven to an off state and the cross coupling drives the transistor 46 on. Thus the voltage at the node 34 goes high and a "1" is stored in the cell 20. The inverse bitline 0 is low as the node 36 is effectively grounded when the transistor 48 is off. A "0" is stored by placing a low voltage on the bitline 0 and a high voltage on the inverse bitline 0. These voltages drive the transistor 48 into conduction and the transistor 46 goes off, driving the node 34 to ground.

The bit stored in the memory cell 20 is read by selecting the wordline 0 and determining the difference between the voltage on the bitline 0 and the inverse bitline 0. A sense amplifier (not shown in FIG. 2) measures the voltage differential and provides an output bit representative of the stored bit.

BRIEF SUMMARY OF THE INVENTION

To identify an individual integrated circuit or die, power is applied to a block of memory cells on the integrated circuit. In response, each of the memory cells assumes an initial state (either a binary one or a binary zero) that is relatively consistent for each power up. The states are determined and used to identify the integrated circuit.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

FIG. 4 is a flowchart according to the teachings of the present invention; and.

DETAILED DESCRIPTION OF THE INVENTION

Figure 1:
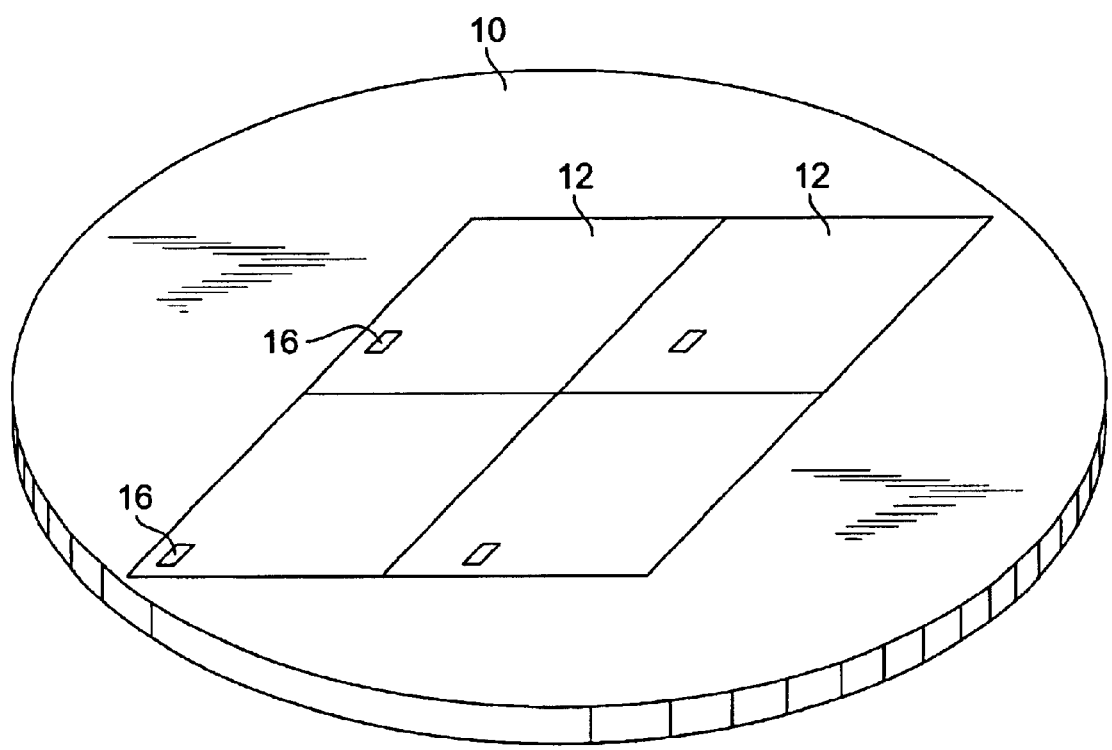
FIG. 1 is perspective view of a semiconductor wafer.

Before describing in detail the particular semiconductor identification method and apparatus in accordance with the present invention, it should be observed that the present invention resides primarily in a novel and nonobvious combination of hardware elements and processing steps. Accordingly, the elements and steps have been represented by conventional elements in the drawings, showing only those specific details that are pertinent to the present invention, so as not to obscure the disclosure with structural details that will be readily apparent to those skilled in the art having the benefit of the description herein.

Figure 2:
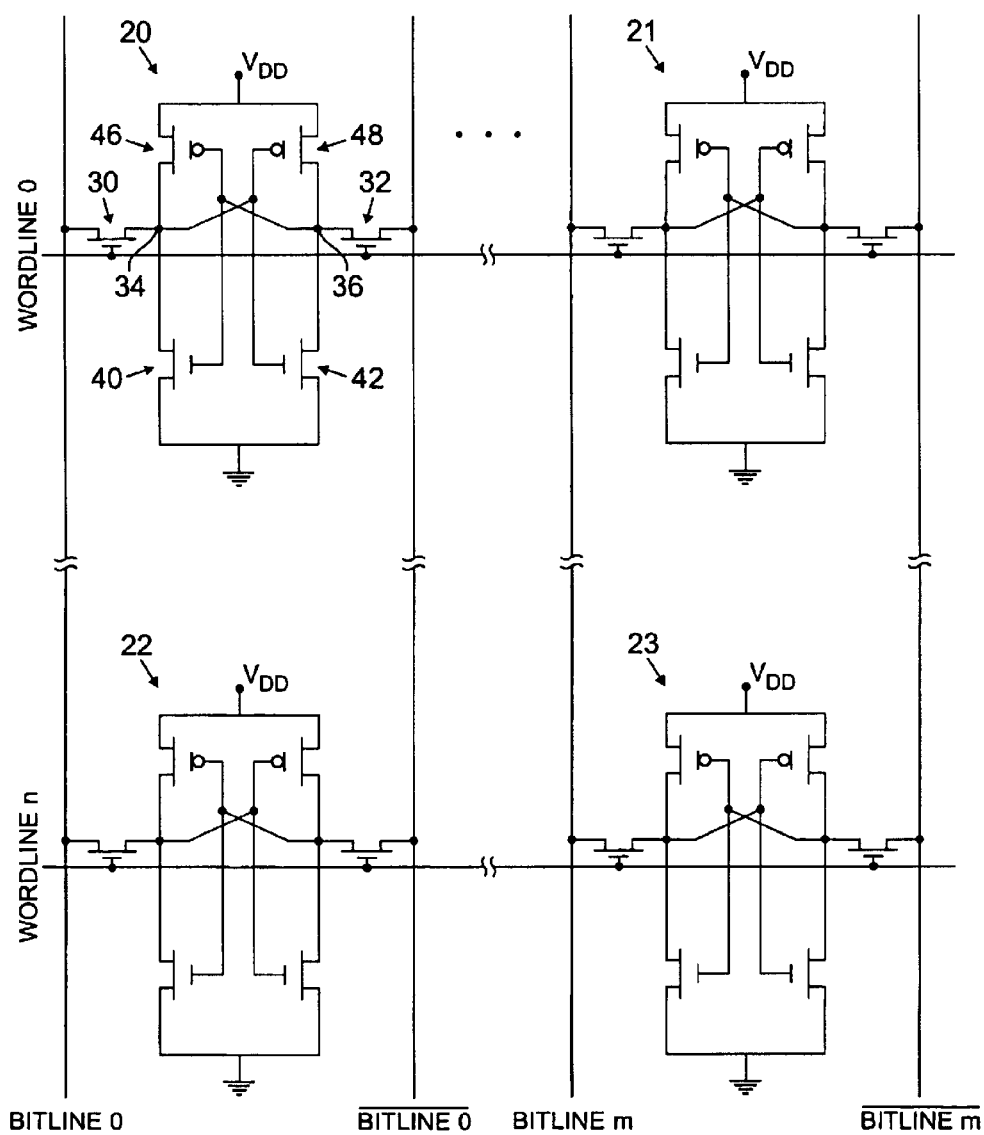
FIG. 2 is schematic diagram of an SRAM.

With respect to the SRAM memory array 18 of FIG. 2, it is known that process mismatches and non-identical device features can cause each of the transistors in the memory cell 20 to have a different threshold voltage and/or drive current. Among the many factors affecting the threshold voltage and drive current are the doping levels of the source and drain regions, the oxide capacitance, the various oxide interface trapped charges, and the channel width and length.

When power is first applied to the memory array 18 (i.e., application of the voltage $V_{DD}$ and connection to ground) the imbalance in the threshold voltage and drive current factors causes one of the two transistors 46 and 48 to turn on before the other, or to turn on more strongly, thus determining the initial state of the memory cell 20 at power up. For example, if the transistor 46 turns on before the transistor 48, the initial is a high at the node 34 and on the bitline 0.

It has further been determined, according to the present invention, that the power up memory state of each cell is substantially repeatable and consistent each time power is applied to the memory array 18, to the extent that the effects caused by the mismatches described above are more significant than the random thermal noise and the 1/f noise that is presenting in all electronics circuits. The initial states are also spatially random. That is, the initial 0 and 1 states are randomly distributed across the entire memory array 18. Although a conventional SRAM comprises several million cells, such as the cell 20 of FIG. 2, it has been observed that the initial state of many of the memory cells within the SRAM is relatively consistent each time power is applied. Since the transistor mismatches influence start-up behavior, most cells power up in the same state at each power up cycle. Thus the initial state serves as a signature or fingerprint for the memory array 18. This signature can be used to associate various indicia with the SRAM, including wafer lot, wafer number within the lot, die site, etc.

In addition to using the start-up state of certain cells within the memory array 18 as an identification tool, in another embodiment the memory array 18 can be included on the die of an active device. Thus the start-up state of the memory array 18 provides a signature for the active device.

For any memory cells where the transistors are closely matched, the initial state is randomly determined by unpredictable start-up events (due to, for example, the random shot noise and 1/f noise described above) and thus the start-up states are not repeatable. Thus these cells cannot be used for identification purposes.

According to the teachings of the present invention, a die identifier is based on the initial power-on state of a block of SRAM cells, such as the cells 20, 21, 22 and 23 of the memory array 18. Prior to singulating the wafer into individual die, power is applied to the memory cells on each die and the initial state of the memory cells is determined. The "1" and "0" values stored in the cells are recorded, with reference to the wafer number, manufacturing lot, die site and any other identification information that may later be useful for tracking the origin of the die. In one embodiment, a memory block comprising about 1000 memory cells that power-up in a repeatable state is used as the die identifier.

It is known that most state-of-of-the-art integrated circuit devices include at least a small number of memory cells required during device operation. Thus the die identification process according to the present invention can be advantageously employed without adding extra cost to the design or fabrication of the device. For fabricated die lacking SRAM cells, a block of such cells can be added to the die at little additional cost and complexity. Further, since the die identification process is executed only when there is a die failure or when it is necessary to identify the packaged die, the memory cells used for identification purposes as described above, can be used to store operational data during operation of the integrated circuit. No extra memory cells are required for die identification as the cells that are used for identification are also used during operation.

Figure 3:
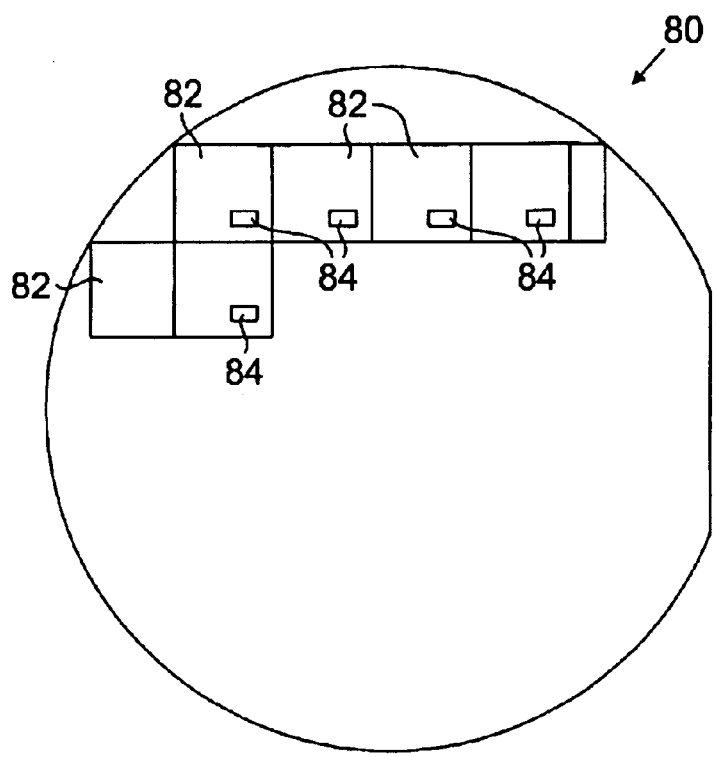
FIG. 3 illustrates a wafer to which the teachings of the present invention can be applied.

FIG. 3 illustrates a wafer 80 comprising a plurality of die 82, wherein each die further comprises a plurality of memory elements 84, wherein the power-up state of the memory elements 84 identifies the die with which the memory element is associated. Each one of the plurality of memory elements 84 comprises a memory cell, such as the memory cell 20 of FIG. 2.

Figure 4:
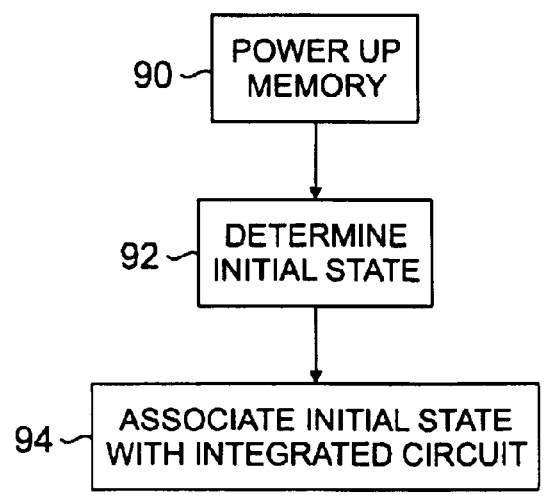

FIG. 4 illustrates a method according to the present invention for identifying an integrated circuit die by associating certain die indicia, comprising the start-up state of certain memory locations on the die, with various useful die characteristics, including the wafer lot and the wafer number from which the die was singulated, and the location of the die on the wafer.

During the wafer fabrication process, the wafer is subjected to various known processes, including forming semiconductor regions by the introduction of dopants and forming metallization conductors to interconnect the semiconductor regions. Certain of the formed semiconductor regions comprise a memory array, further comprising a plurality of memory cells or memory locations. Other regions comprise integrated circuit devices. The wafer comprises a plurality of die, wherein certain of the die comprise both an integrated circuit device and a memory array. Certain others of the die can comprise primarily a memory array.

According to the teachings of the present invention as illustrated in FIG. 4, at a step 90 the memory array, such as the memory array 18, on the integrated circuit device is powered up. The memory cells of the array, such as the cells 20, 21, 22 and 23 assume an initial state due to feature mismatches among the memory cell transistors, as described above. At a step 92 the initial states are determined and recorded. Preferably, the steps 90 and 92 are executed several times to identify those memory cells that exhibit a consistent start-up state.

At a step 94, the memory cells exhibiting a consistent start-up state are selected and the initial state of the selected memory cells is recorded. These selected memory cells are then associated with the integrated circuit die. Preferably, this association involves the creation of a record that relates the start-up state pattern, including the location of the selected memory cells and the start-up state of each selected cell, with the wafer identifier, the wafer manufacturing lot, and other wafer processing details that may be useful for determining the cause of die failures. To associate the selected memory cells with the integrated circuit die, the method according to FIG. 4 can be executed before the wafer is singulated into individual die. Thus the die location can also be determined and recorded along with the wafer processing information.

Figure 5:
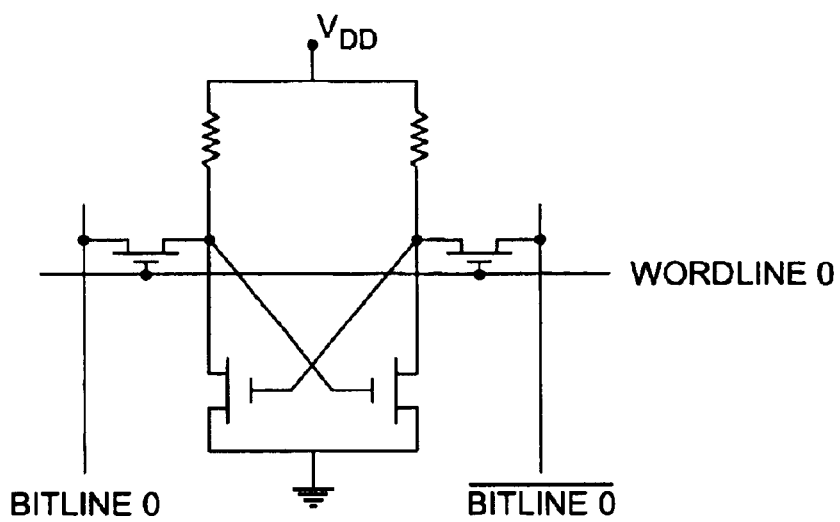
FIGS. 5 through 7 are schematic diagrams of alternative embodiments of memory cells for a static random access memory.
Figure 6:
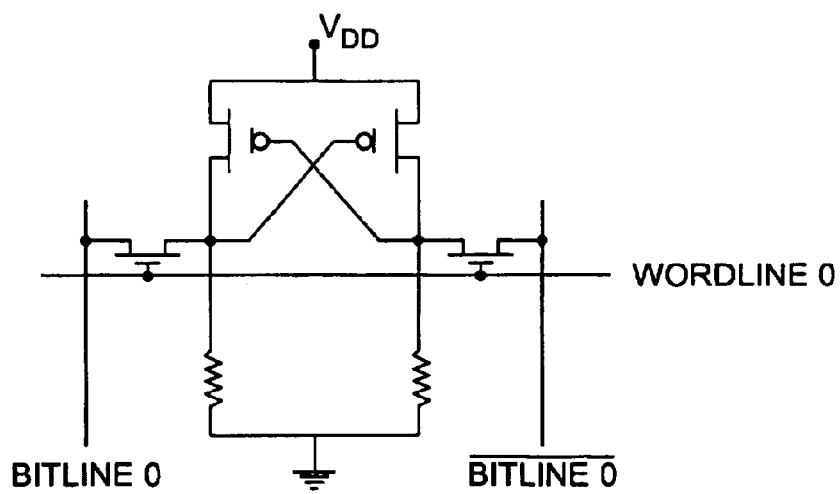
Figure 7:
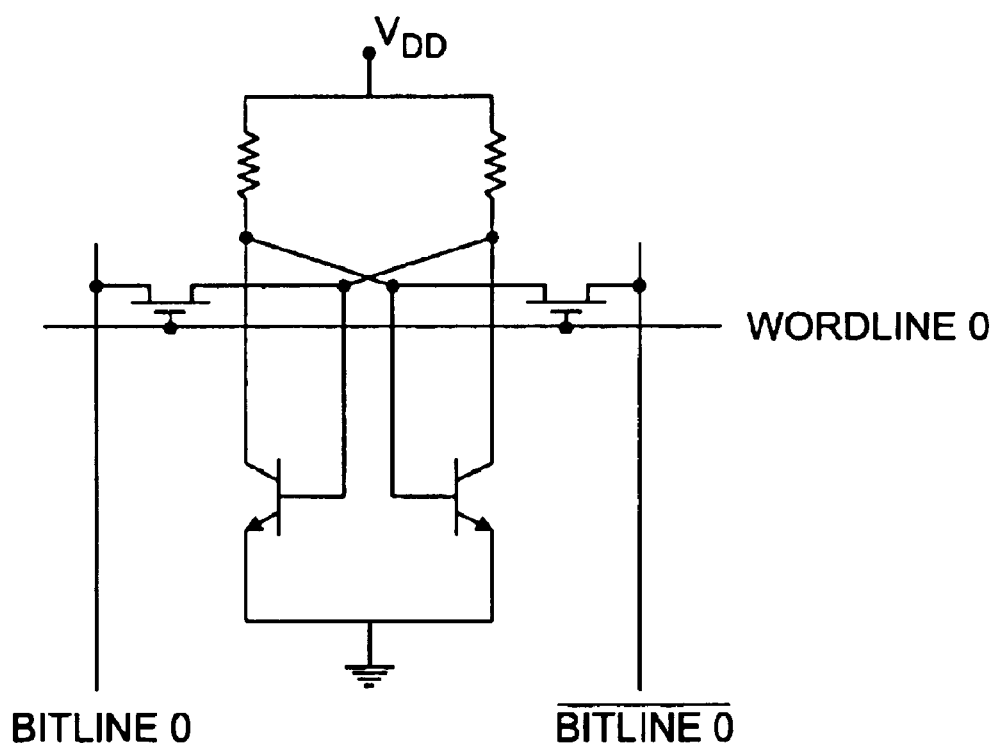

In other embodiments of the present invention, NMOS, PMOS and bipolar transistor configurations, including their associated resistors, as illustrated in FIGS. 5, 6 and 7, form the memory cells 20, 21 and 22 and 23, a plurality of which form the memory array 18. As is known to those skilled in the art, operation of these embodiments is similar to the cross-coupled CMOS embodiment described above.

While the invention has been described with reference to preferred embodiments, it will be understood by those skilled in the art that various changes may be made and equivalent elements may be substituted for elements thereof without departing from the scope of the present invention. The scope of the present invention further includes any combination of the elements from the various embodiments set forth herein. In addition, modifications may be made to adapt a particular situation to the teachings of the present invention without departing from its essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for identifying an integrated circuit device including memory cells therewith, comprising:
   (a) applying power to the memory cells;
   (b) determining the initial state of the memory cells;
   (c) repeating the steps (a) and (b) until a plurality of the memory cells are determined to exhibit an initial state that is relatively consistent each time the step (a) is executed; and
   (d) associating the initial state of the plurality of memory cells with the integrated circuit device.

2. The method of claim 1 wherein the plurality of memory cells comprise a static random access memory.

3. The method of claim 1 wherein the initial state is represented by a binary "0" or a binary "1".

4. The method of claim 1 wherein the integrated circuit device is one of a plurality of integrated circuit devices formed from a semiconductor wafer, and wherein the initial state of the plurality of memory cells is associated with the semiconductor wafer from which the integrated circuit device was formed.

5. The method of claim 1 wherein the integrated circuit device is one of a plurality of integrated circuit devices formed from a semiconductor wafer during fabrication of a wafer lot, and wherein the initial state of the plurality of memory cells is associated with the wafer lot from which the integrated circuit device was formed.

6. The method of claim 1 wherein the integrated circuit device is formed during processing steps, and wherein the initial state of the plurality of memory cells is associated with the processing steps.

7. The method of claim 1 wherein the step (d) further comprises forming a map of the plurality of memory cells, wherein the map identifies the position of the plurality of memory cells and the initial state of each one of the plurality of memory cells.

8. The method of claim 7 wherein the step (d) further comprises associating the map with the integrated circuit device.

9. The method of claim 1 wherein each one of the plurality of memory cells comprises cross-coupled inverters.

10. The method of claim 9 wherein the cross-coupled inverters comprise active devices, and wherein the active devices are selected from among complimentary MOSFETs, NMOSFETs, PMOSFETs and bipolar transistor devices.

11. A method for manufacturing semiconductor devices, comprising:
   (a) providing a semiconductor substrate;
   (b) performing semiconductor fabrication processes on the semiconductor substrate to form semiconductor devices thereon, wherein the semiconductor substrate comprises a plurality of semiconductor die, and wherein each die comprises a plurality of semiconductor devices, and wherein certain of the die include memory cells;

(c) applying power to the memory cells of each die comprising memory cells;

(d) determining the initial state of the memory cells;

(e) repeating the steps (c) and (d) until a plurality of the memory cells on a die are determined to exhibit an initial state that is relatively consistent each time the step (c) is executed;

(f) associating the initial state of the plurality of memory cells with the die on which the memory cells are located;

(g) singulating the semiconductor substrate into individual die; and (h) maintaining the association after the die are singulated.

12. The method of claim 11 wherein the step (f) further comprises associating the initial state of the plurality of memory cells with indicia related to the semiconductor substrate.

13. The method of claim 11 wherein the step (f) further comprises associating the initial state of the plurality of memory cells with the semiconductor fabrication processes performed on the semiconductor substrate according to the step (b).

* * * * *